(12) United States Patent
Soliman et al.

(10) Patent No.: US 12,418,299 B2
(45) Date of Patent: Sep. 16, 2025

(54) APPARATUS COMPRISING A COMPARATOR DEVICE, AND OPERATING METHOD THEREFOR

(71) Applicant: Robert Bosch GmbH, Stuttgart (DE)

(72) Inventors: Taha Soliman, Renningen (DE); Tobias Kirchner, Ludwigsburg (DE)

(73) Assignee: ROBERT BOSCH GMBH, Stuttgart (DE)

( * ) Notice: Subject to any disclaimer, the term of this patent is extended or adjusted under 35 U.S.C. 154(b) by 159 days.

(21) Appl. No.: 18/491,168

(22) Filed: Oct. 20, 2023

(65) Prior Publication Data

US 2024/0120930 A1 Apr. 11, 2024

(30) Foreign Application Priority Data

Oct. 6, 2022 (DE) .......................... 102022210593.1

(51) Int. Cl.
*H03M 1/06* (2006.01)
(52) U.S. Cl.
CPC ................................ *H03M 1/0607* (2013.01)
(58) Field of Classification Search
CPC .................................................. H03M 1/0607
See application file for complete search history.

(56) References Cited

U.S. PATENT DOCUMENTS

| | | | | |
|---|---|---|---|---|
| 8,410,967 B2* | 4/2013 | Hales | ................... | H03K 5/2472 |
| | | | | 341/158 |
| 9,829,906 B2* | 11/2017 | Yamahana | .............. | G05F 3/262 |
| 11,838,665 B2* | 12/2023 | Kobayashi | ............. | H04N 25/78 |
| 2006/0290551 A1 | 12/2006 | Suzuki | | |
| 2010/0073034 A1* | 3/2010 | Valentino | .......... | G01R 19/16571 |
| | | | | 327/77 |
| 2013/0009800 A1* | 1/2013 | Yang | ................... | H03F 3/45744 |
| | | | | 327/63 |
| 2013/0214819 A1* | 8/2013 | Knoedgen | ............ | H03K 5/2481 |
| | | | | 327/101 |
| 2019/0058483 A1* | 2/2019 | Kim | ........................ | H03M 1/14 |
| 2020/0052682 A1* | 2/2020 | Mcgowan | ........ | G01R 19/16519 |
| 2021/0211045 A1* | 7/2021 | Guiraud | ................... | H03G 3/30 |

FOREIGN PATENT DOCUMENTS

DE 102020211818 A1 3/2022

* cited by examiner

*Primary Examiner* — Mohamed Barakat
(74) *Attorney, Agent, or Firm* — NORTON ROSE FULBRIGHT US LLP

(57) ABSTRACT

An apparatus. The apparatus includes at least a first comparator device, which is designed to compare a first input current with a first reference current and, based on the comparison, to output a first output current to a second comparator device, wherein the first output current corresponds to a difference of the first reference current and the first input current if the first input current is smaller than the first reference current, and wherein the first output current corresponds to a difference of the first input current and the first reference current if the first input current is greater than or equal to the first reference current.

16 Claims, 11 Drawing Sheets

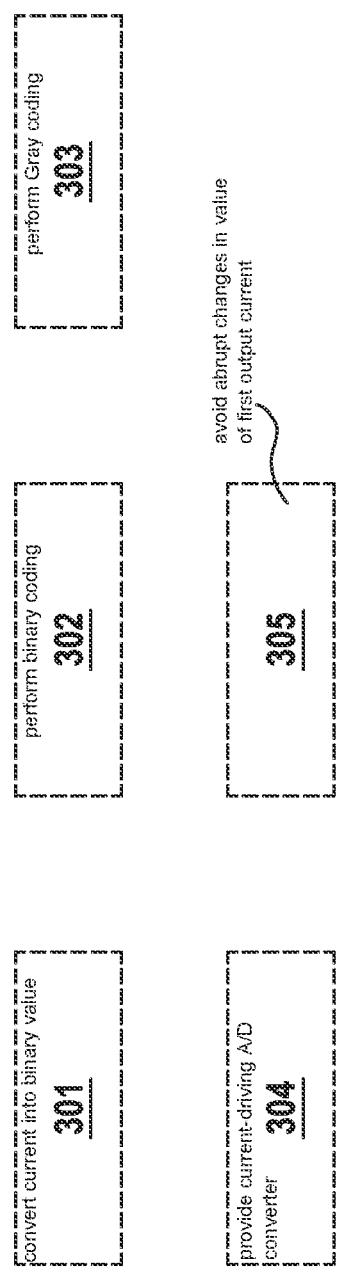

APPARATUS COMPRISING A COMPARATOR DEVICE, AND OPERATING METHOD THEREFOR

FIELD

The present invention relates to an apparatus comprising at least a first comparator device, which is designed to compare a first input current with a first reference current.

The present invention furthermore relates to a method for operating such an apparatus.

SUMMARY

Exemplary embodiments of the present invention relate to an apparatus comprising at least a first comparator device, which is designed to compare a first input current with a first reference current and, based on the comparison, to output a first output current to a second comparator device, wherein the first output current corresponds to a difference of the first reference current and the first input current if the first input current is smaller than the first reference current, and wherein the first output current corresponds to a difference of the first input current and the first reference current if the first input current is greater than or equal to the first reference current. In further exemplary embodiments of the present invention, this makes it possible to provide, for example, current-based, e.g., current-driven, analog/digital converter devices and/or to avoid abrupt changes in a value of at least the first output current. For example, one comparator device of the apparatus can be provided per stage of an analog/digital converter device.

In further exemplary embodiments of the present invention, it is provided that the apparatus comprises n comparator devices, wherein a k-th comparator device, with $k=1, \ldots, n-1$, is designed to compare a k-th input current that can be supplied or is supplied thereto with a k-th reference current and, based on the comparison, to output a k-th output current to a (k+1)-th comparator device, wherein the k-th output current corresponds to a difference of the k-th reference current and the k-th input current if the k-th input current is smaller than the k-th reference current, and wherein the k-th output current corresponds to a difference of the k-th input current and the k-th reference current if the k-th input current is greater than or equal to the k-th reference current.

In further exemplary embodiments of the present invention, it is provided that at least the first comparator device, for example some or all of the n comparator devices, is or are designed to output a comparison result based on the comparison, for example in the form of a two-value signal. In further exemplary embodiments in which the apparatus can be used or is used, for example, to provide an analog/digital converter device, the comparison result can characterize a bit of a binary value, for example.

In further exemplary embodiments of the present invention, it is provided that the first comparator device comprises a first circuit node for receiving the first input current, and a first reference current device, which is designed to derive the first reference current from the first circuit node, wherein, for example, a k-th comparator device (with $k=1, \ldots, n$) comprises a particular first circuit node for receiving a k-th input current, and a k-th reference current device, which is designed to derive the k-th reference current from the first circuit node of the k-th comparator device.

In further exemplary embodiments of the present invention, it is provided that the first reference current device is designed to provide the first output current at least temporarily, for example when the first input current is smaller than the first reference current, wherein, for example, the k-th reference current device is designed to provide the k-th output current at least temporarily, for example when the k-th input current is smaller than the k-th reference current.

In further exemplary embodiments of the present invention, it is provided that the first comparator device comprises a first differential current supply device, which is designed to provide the first output current at least temporarily, for example when the first input current is greater than or equal to the first reference current, wherein, for example, the k-th comparator device comprises a k-th differential current supply device, which is designed to provide the k-th output current at least temporarily, for example when the k-th input current is greater than or equal to the k-th reference current.

In further exemplary embodiments of the present invention, it is provided that the first comparator device comprises a second circuit node for outputting the first output current to the second comparator device, wherein, for example, the k-th comparator device comprises a second circuit node for outputting the k-th output current to the (k+1)-th comparator device.

In further exemplary embodiments of the present invention, it is provided that an element for potential isolation is provided between the first circuit node and the second circuit node, wherein, for example, the element for potential isolation comprises at least one of the following elements: a) a diode, b) a transistor. In further exemplary embodiments, signals or electrical potentials which are associated with the respective comparison results of, for example, interconnected comparator devices can thereby be isolated from one another.

In further exemplary embodiments of the present invention, it is provided that the first comparator device comprises a third circuit node for receiving the first input current, wherein, for example, the k-th comparator device comprises a third circuit node for receiving the k-th output current. In further exemplary embodiments, it is provided that a second circuit node of the first comparator device can be connected or is connected to a third circuit node of a second comparator device, whereby, for example, the second comparator device can be supplied with a first output current of the first comparator device as a second input current. In further exemplary embodiments, this principle can also be applied to a plurality of further, for example all, comparator devices of the apparatus.

In further exemplary embodiments of the present invention, it is provided that an element for potential isolation is provided between the first circuit node and the third circuit node, wherein, for example, the element for potential isolation comprises a transistor, for example a field-effect transistor designed as a source follower. This enables electrical potential isolation of, e.g., interconnected, e.g., series-connected, comparator devices, which, when an optional current mirror device is used in at least one of the comparator devices, can increase a precision of the operation of the optional current mirror device.

In further exemplary embodiments of the present invention, it is provided that the first reference current device comprises a transistor, for example a field-effect transistor, the load path of which is connected between the first circuit node and a first reference potential of the first comparator device. A reference current can thus be efficiently provided in further exemplary embodiments. In further exemplary embodiments, a current intensity of the reference current can be specified or influenced by at least one of the following elements: a) a control of the transistor, b) dimensions of at least one component of the transistor, e.g., gate width in the case of a field-effect transistor.

In further exemplary embodiments of the present invention, it is provided that the first differential current supply device comprises a first transistor, for example a field-effect transistor, the load path of which is connected between the second circuit node and a, or the, first reference potential of the first comparator device.

In further exemplary embodiments of the present invention, it is provided that the first transistor of the first differential current supply device can be controlled based on an electrical potential of the first circuit node of the first comparator device, i.e., for example, based on a comparison result of the first comparator device. For example, the first transistor of the first differential current supply device, together with a second transistor of the first differential current supply device, can form a current mirror device, which can be controlled by means of a third transistor of the first differential current supply device, for example based on the electrical potential of the first circuit node of the first comparator device. In this way, it can be brought about efficiently that, as soon as the first input current exceeds the first reference current and a change in potential thus occurs at the first circuit node, the first transistor of the first differential current supply device provides the first output current from then on.

Further exemplary embodiments of the present invention relate to an analog/digital converter device, for example a current-driven analog/digital converter device, comprising at least one apparatus according to the embodiments. In further exemplary embodiments, a comparator device of the apparatus can respectively correspond to a stage of the analog/digital converter device. In further exemplary embodiments, a multistage, e.g., n-stage (n>1), analog/digital converter device can thus be realized on the basis of an apparatus with n comparator devices, which are, for example, electrically connected in series, for example in such a way that a first output current of the first comparator device can be supplied to a second comparator device as a second input current, etc.

In further exemplary embodiments of the present invention, it is provided that the at least one apparatus includes n comparator devices, wherein each of the n comparator devices is associated with a valency of the analog/digital converter device, wherein a particular reference current of the n comparator devices is associated with the valency of the particular comparator device.

In further exemplary embodiments of the present invention, different reference currents, for example for different comparator devices or stages of the analog/digital converter device, can be provided by at least one of the following elements: a) individual reference current source, b) current mirror device.

In further exemplary embodiments of the present invention, it is provided that the analog/digital converter device is designed to transform the first input current into a digital, for example binary, variable, wherein, for example, the digital variable comprises Gray coding.

In further exemplary embodiments of the present invention, it is provided that a transcoding device is provided, which is designed to transcode a digital Gray-coded variable into a binary-coded variable.

Further exemplary embodiments of the present invention relate to a computing device, for example for ascertaining a scalar product, for example a vector matrix multiplier, for example a dot product engine, comprising a matrix of elements with a controllable electrical resistor, and at least one analog/digital converter device according to the embodiments.

Further exemplary embodiments of the present invention relate to a method for operating an apparatus comprising at least a first comparator device, which is designed to compare a first input current with a first reference current and, based on the comparison, to output a first output current to a second comparator device, wherein the first output current corresponds to a difference of the first reference current and the first input current if the first input current is smaller than the first reference current, and wherein the first output current corresponds to a difference of the first input current and the first reference current if the first input current is greater than or equal to the first reference current, wherein the method comprises: comparing the first input current with the first reference current, outputting the first output current to a second comparator device.

Further exemplary embodiments of the present invention relate to a use of the apparatus according to the embodiments and/or of the analog/digital converter device according to the embodiments and/or of the computing device according to the embodiments and/or of the method according to the embodiments for at least one of the following elements: a) converting a current into a binary value, b) performing binary coding, c) performing Gray coding, d) providing a current-driven, for example completely current-driven, analog-to-digital converter, e) avoiding abrupt changes in a value of at least the first output current.

Further features, possible applications, and advantages of the present invention emerge from the following description of exemplary embodiments of the present invention, which are shown in the figures. All of the features described or shown form the subject matter of the present invention individually or in any combination, irrespective of their wording or representation in the description herein or in the figures.

BRIEF DESCRIPTION OF THE DRAWINGS

FIG. 13 schematically shows aspects of uses according to exemplary embodiments of the present invention.

DETAILED DESCRIPTION OF EXAMPLE EMBODIMENTS

Exemplary embodiments (FIG. 1) relate to an apparatus 100 comprising at least a first comparator device 110-1, which is designed to compare a first input current I_in-1 with a first reference current I_ref-1 (see also block 200 according to FIG. 2) and, based on the comparison 200, to output a first output current I_out-1 to a second comparator device 110-2 (FIG. 1) (see also block 202 according to FIG. 2), wherein the first output current I_out-1 corresponds to a difference I_ref-1–I_in-1 of the first reference current I_ref-1 and the first input current I_in-1 if the first input current I_in-1 is smaller than the first reference current I_ref-1, and wherein the first output current I_out-1 corresponds to a difference I_in-1–I_ref-1 of the first input current I_in-1 and the first reference current I_ref-1 if the first input current I_in-1 is greater than or equal to the first reference current I_ref-1. In further exemplary embodiments, this makes it possible to provide, for example, current-based, e.g., current-driven, analog/digital converter devices and/or to avoid abrupt changes in a value of at least the first output current. For example, one comparator device 110-1, 110-2, . . . of the apparatus 100 can be provided per stage of an analog/digital converter device.

Figure 1:
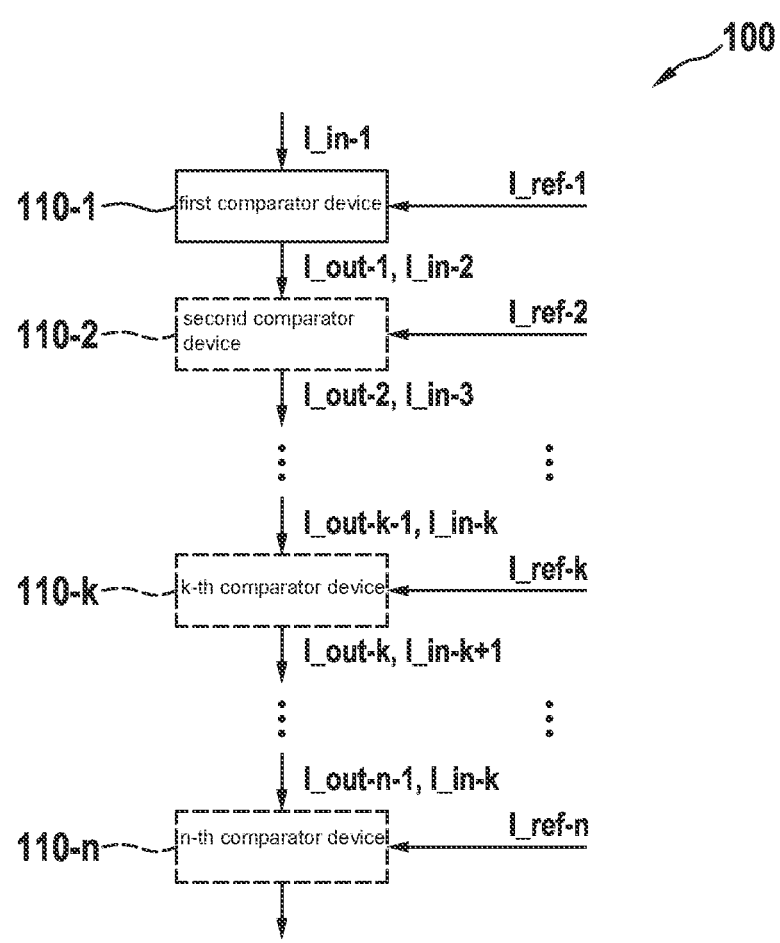
FIG. 1 schematically shows a simplified block diagram according to exemplary embodiments of the present invention.
Figure 2:
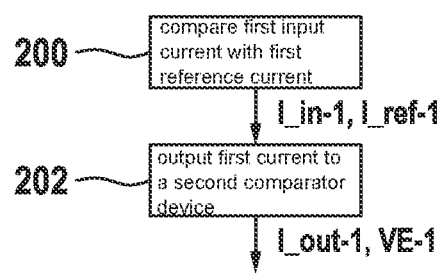
FIG. 2 schematically shows a simplified flowchart according to exemplary embodiments of the present invention.

In further exemplary embodiments, various circuit implementations of the apparatus 100 shown schematically, by way of example, in a simplified manner in FIG. 1 are possible. For example, the first output current I_out-1 can therefore be a positive or a negative current (both current directions are possible), for example depending on the circuit implementation. The "outputting" of an output current I_out-1 can thus comprise the outputting of a positive current or of a negative current. This also applies, for example, to any further below-described output currents, for example further comparator devices 110-2, . . . .

In further exemplary embodiments (FIG. 1), the second comparator device 110-2 can have a function comparable with the first comparator device 110-1, wherein, for example, the first output current I_out-1 of the first comparator device 110-1 forms the input current I_in-2 of the second comparator device 110-2, etc. According to further exemplary embodiments, the principle mentioned can be applied to n>1 comparator devices (see the vertical points in FIG. 1).

Figure 3:
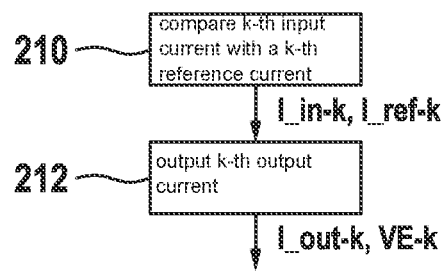
FIG. 3 schematically shows a simplified flowchart according to exemplary embodiments of the present invention.

In further exemplary embodiments, it is accordingly provided that the apparatus 100 comprises n, n>=2, comparator devices 110-1, 110-2, . . . , 110-n, wherein a k-th comparator device 110-k, with k=1, . . . , n−1, is designed to compare a k-th input current I_in-k that can be supplied or is supplied thereto with a k-th reference current I_ref-k (see also block 210 according to FIG. 3) and, based on the comparison 210, to output a k-th output current I_out-k to a (k+1)-th comparator device (not shown) (see also block 212 according to FIG. 3), wherein the k-th output current I_out-k corresponds to a difference I_ref-k–I_in-k of the k-th reference current I_ref-k and the k-th input current I_in-k if the k-th input current I_in-k is smaller than the k-th reference current I_ref-k, and wherein the k-th output current I_out-k corresponds to a difference I_in-k–I_ref-k of the k-th input current I_in-k and the k-th reference current I_ref-k if the k-th input current I_in-k is greater than or equal to the k-th reference current I_ref-k.

In further exemplary embodiments (FIG. 1), it is provided that at least the first comparator device 110-1, for example some or all of the n comparator devices 110-1, . . . , 110-n, is or are designed to output a comparison result VE-1 (FIG. 2), VE-k (FIG. 3) based on the comparison 200, 210, for example in the form of a two-value signal. In further exemplary embodiments in which the apparatus 100 can be used or is used, for example, to provide an analog/digital converter device, the comparison result VE-1, VE-k can characterize a bit of a binary value, for example.

Figure 4A:
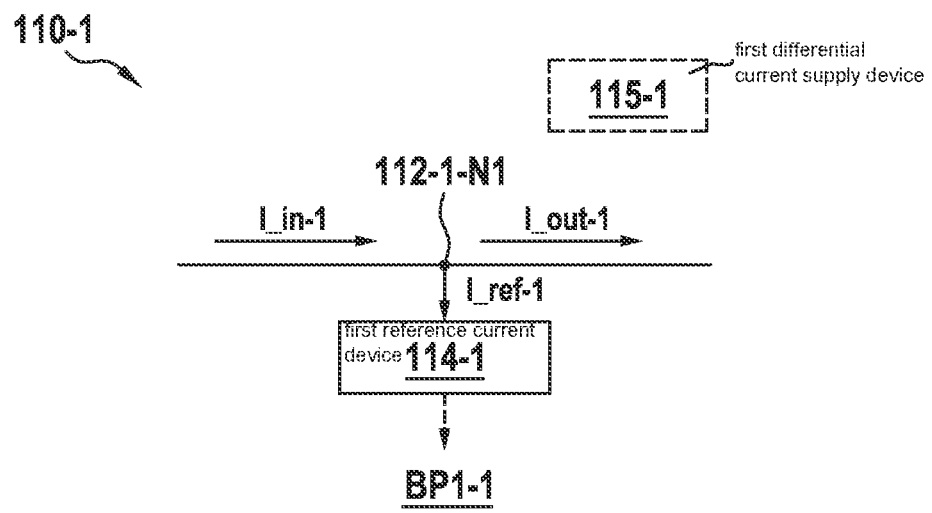
FIG. 4A schematically shows a simplified block diagram according to exemplary embodiments of the present invention.

In further exemplary embodiments (FIG. 4A), it is provided that the first comparator device 110-1 comprises a first circuit node 112-1-N1 for receiving the first input current I_in-1, and a first reference current device 114-1, which is designed to derive the first reference current I_ref-1 from the first circuit node 112-1-N1, for example to form a first reference potential BP1-1 of the first comparator device 110-1.

Figure 4B:
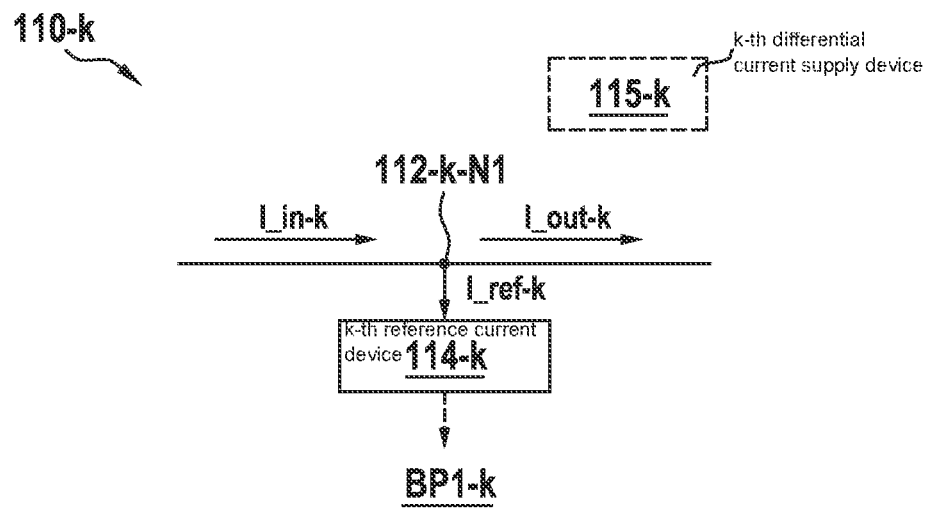
FIG. 4B schematically shows a simplified block diagram according to exemplary embodiments of the present invention.

In further exemplary embodiments (FIG. 4B), it is provided that a k-th comparator device 110-k (with k=1, . . . , n) comprises a particular first circuit node 112-k-N1 for receiving a k-th input current I_in-k, and a k-th reference current device 114-k, which is designed to derive the k-th reference current I_ref-k from the first circuit node 112-k-N1 of the k-th comparator device 110-k, for example to form a first reference potential BP1-k of the k-th comparator device 110-k.

In further exemplary embodiments (FIG. 4A), it is provided that the first reference current device 114-1 is designed to provide the first output current I_out-1 at least temporarily, for example when the first input current I_in-1 is smaller than the first reference current I_ref-1, wherein, for example, the k-th reference current device (FIG. 4B) is designed to provide the k-th output current I_out-k at least temporarily, for example when the k-th input current I_in-k is smaller than the k-th reference current I_ref-k.

Figure 5A:
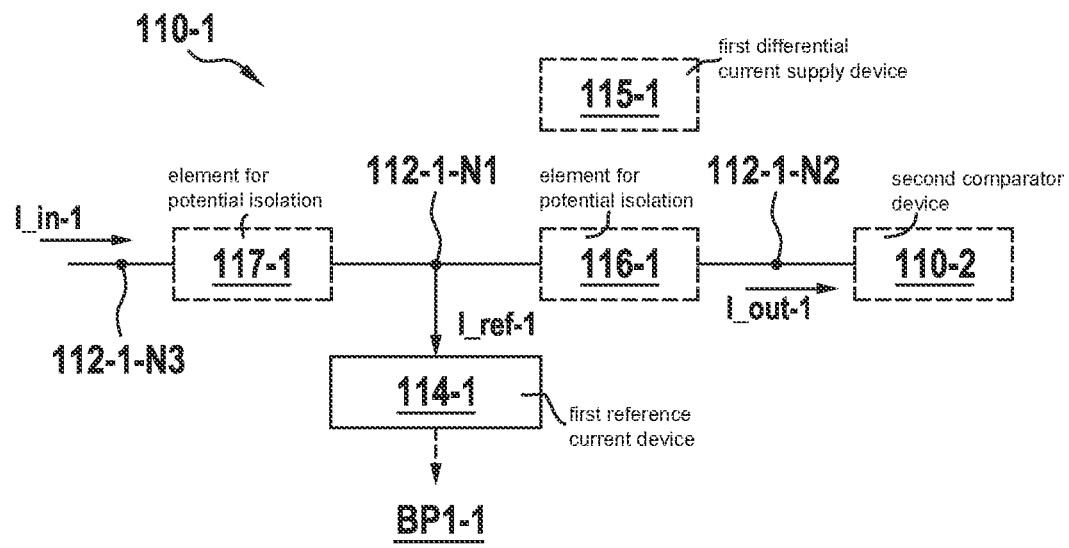
FIG. 5A schematically shows a simplified block diagram according to exemplary embodiments of the present invention.
Figure 5B:
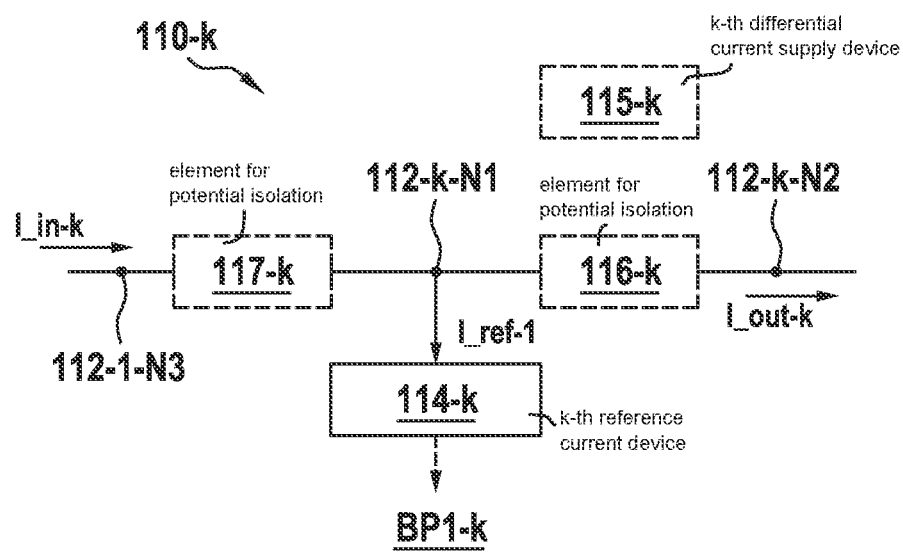
FIG. 5B schematically shows a simplified block diagram according to exemplary embodiments of the present invention.

In further exemplary embodiments (FIG. 5A), it is provided that the first comparator device 110-1 comprises a first differential current supply device 115-1, which is designed to provide the first output current I_out-1 at least temporarily, for example when the first input current I_in-1 is greater than or equal to the first reference current I_ref-1, wherein, for example, the k-th comparator device 110-k (with k=1, n) (FIG. 5B) comprises a k-th differential current supply device 115-k, which is designed to provide the k-th output current I_out-k at least temporarily, for example when the k-th input current I_in-k is greater than or equal to the k-th reference current I_ref-k.

In further exemplary embodiments (FIG. 5A), it is provided that the first comparator device 110-k comprises a second circuit node 112-1-N2 for outputting the first output current I_out-1 to the second comparator device 110-2, wherein, for example, the k-th comparator device 110-k (FIG. 5B) comprises a second circuit node 112-k-N2 for outputting the k-th output current I_out-k to the (k+1)-th comparator device (not shown).

In further exemplary embodiments (FIGS. 5A, 5B), it is provided that an element 116-1 or 116-k for potential isolation is provided between the first circuit node 112-1-N1 or 112-k-N1 and the second circuit node 112-1-N2 or 112-k-N2, wherein, for example, the element 116-1, 116-k for potential isolation comprises at least one of the following elements: a) a diode, b) a transistor. In further exemplary embodiments, signals or electrical potentials which are associated with the respective comparison results of, for example, interconnected comparator devices and which occur at the circuit nodes 112-1-N1 or 112-k-N1 and 112-1-N2 or 112-k-N2 can thereby be isolated from one another.

In further exemplary embodiments (FIG. 5A), it is provided that the first comparator device 110-1 comprises a third circuit node 112-1-N3 for receiving the first input current I_in-1, wherein, for example, the k-th comparator device 110-k (FIG. 5B) comprises a third circuit node 112-k-N3 for receiving the k-th input current I_in-k.

In further exemplary embodiments, it is provided that a second circuit node 112-1-N2 of the first comparator device 110-1 can be connected or is connected to a third circuit node (not shown) of the second comparator device 110-2, whereby, for example, the second comparator device 110-2 can be supplied with the first output current I_out-1 of the first comparator device 110-1 as a second input current I_in-2. In further exemplary embodiments, this principle can also be applied to a plurality of further, for example all, comparator devices 110-1, . . . , 110-n of the apparatus 100 (FIG. 1).

Figure 6:
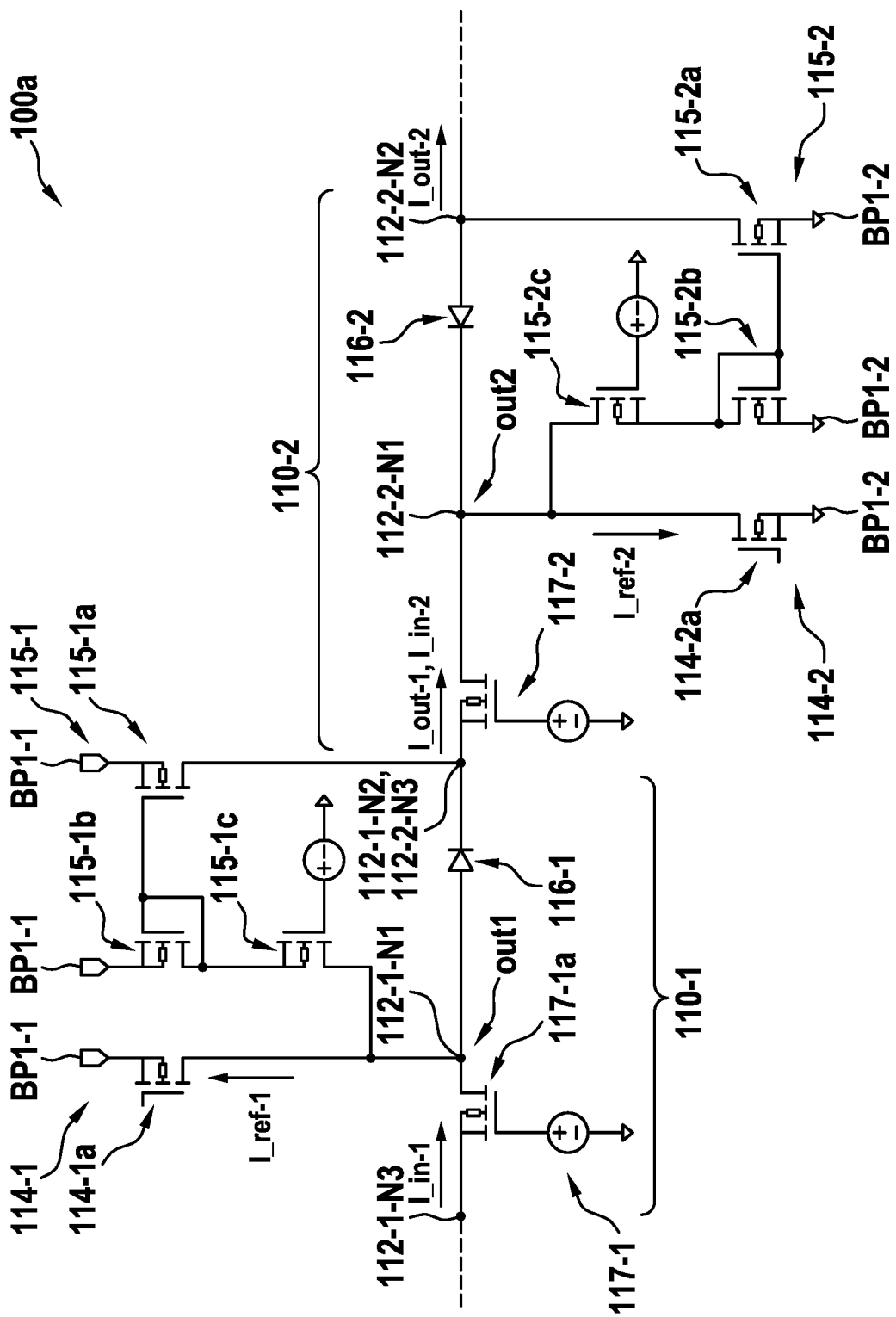
FIG. 6 schematically shows a simplified circuit diagram according to exemplary embodiments of the present invention.

In further exemplary embodiments (FIGS. 5A, 5B), it is provided that an element 117-1 or 117-k for potential isolation is provided between the first circuit node 112-1-N1 or 112-k-N1 and the third circuit node 112-1-N3 or 112-k-N3, wherein, for example, the element for potential isolation comprises a transistor, e.g., a field-effect transistor designed as a source follower (see, for example, element 117-1a according to FIG. 6). This enables electrical potential isolation of, e.g., interconnected, e.g., series-connected, comparator devices, which, when an optional current mirror device is used in at least one of the comparator devices, can increase a precision of the operation of the optional current mirror device.

FIG. 6 schematically shows a simplified circuit diagram of an apparatus 100a according to further exemplary embodiments, of which, by way of example, two series-connected comparator devices 110-1, 110-2 are shown. Optionally, the apparatus 100a comprises further comparator devices and/or other components (not shown in FIG. 6), which is symbolized by the points arranged on the right in FIG. 6.

An input current can be supplied to the apparatus 100a according to FIG. 6 at the third circuit node 112-1-N3 of the first comparator device 110-1 as the first input current I_in-1 for the first comparator device 110-1, which compares the first input current I_in-1 with the first reference current I_ref-1 and provides an electrical potential characterizing the comparison result as an output signal out1 at its first circuit node 112-1-N1.

In further exemplary embodiments (FIG. 6), it is provided that the first reference current device 114-1 comprises a transistor 114-1a, for example a field-effect transistor, the load path (drain-source path) of which is connected between the first circuit node 112-1-N1 and a first reference potential BP1-1 of the first comparator device 110-1. A first reference current I_ref-1 can thus be efficiently provided in further exemplary embodiments. In further exemplary embodiments, a current intensity of the first reference current I_ref-1 can be specified or influenced by at least one of the following elements: a) a control of the transistor 114-1a, b) dimensions of at least one component of the transistor 114-1a, e.g., gate width in the case of a field-effect transistor.

In further exemplary embodiments, the transistor 114-1a can be a part, for example an output, of a current mirror device that provides the first reference current I_ref-1.

In further exemplary embodiments (FIG. 6), it is provided that the first differential current supply device 115-1 comprises a first transistor 115-1a, for example a field-effect transistor, the load path of which is connected between the second circuit node 112-1-N2 and a, or the, first reference potential BP1-1 of the first comparator device 110-1.

In further exemplary embodiments, it is provided that the first transistor 115-1a of the first differential current supply device 115-1 can be controlled based on an electrical potential of the first circuit node 112-1-N1 of the first comparator device 110-1, i.e., for example, based on a comparison result of the first comparator device 110-1.

For example, the first transistor 115-1a of the first differential current supply device 115-1, together with a second transistor 115-1b of the first differential current supply device 115-1, can form a current mirror device, which can, for example, be controlled by means of a third transistor 115-1c of the first differential current supply device 115-1, for example based on the electrical potential of the first circuit node 112-1-N1 of the first comparator device 110-1. In this way, it can be brought about efficiently that, as soon as the first input current I_in-1 exceeds the first reference current I_ref-1 and a change in potential thus occurs at the first circuit node 112-1-N1, the first transistor 115-1a of the first differential current supply device 115-1 provides the first output current I_out-1 from then on.

Figure 7:
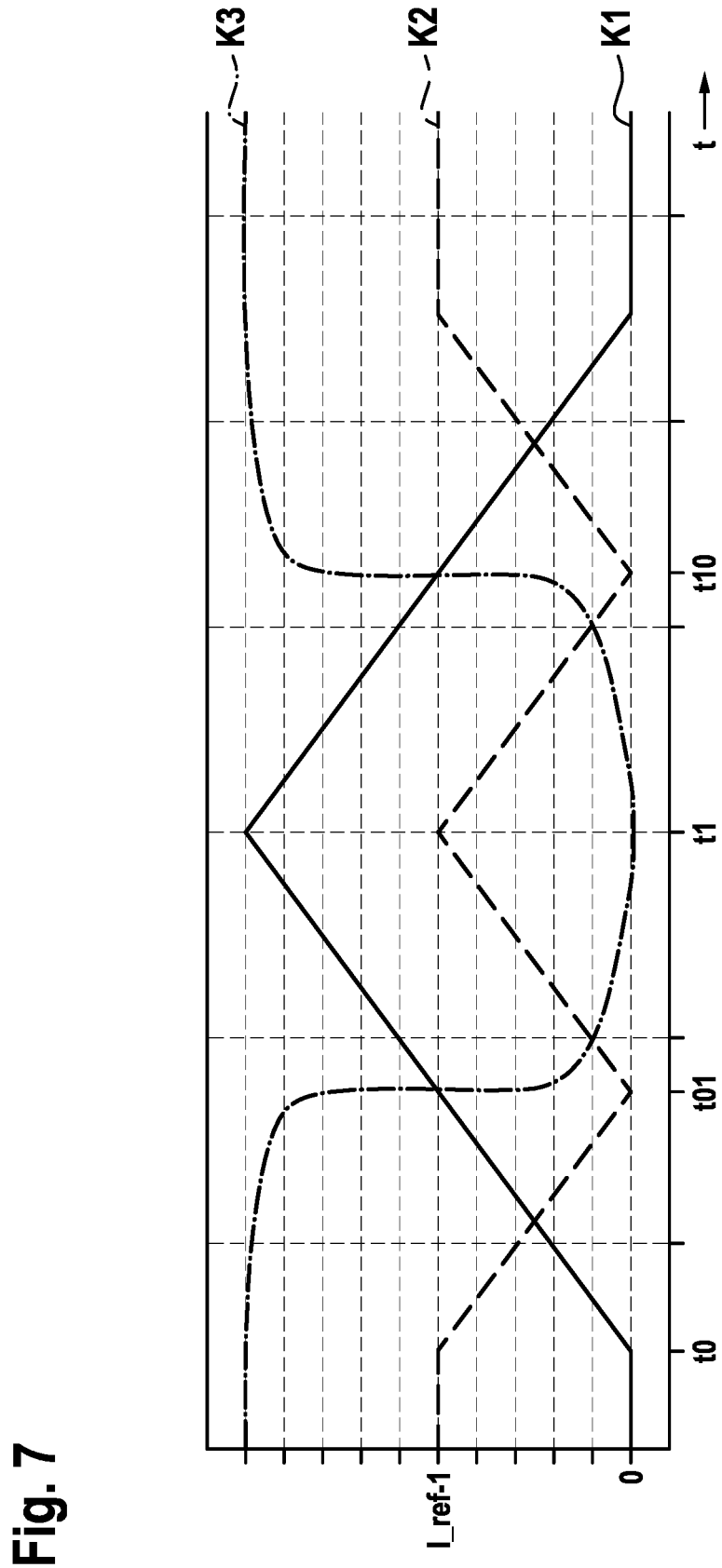
FIG. 7 schematically shows a simplified time diagram according to exemplary embodiments of the present invention.

Further aspects of an operation of the comparator device 110-1 according to FIG. 6, also with reference to FIG. 7, are described below by way of example.

At the time t0, the first input current I_in-1 is zero, and after the time t0, the first input current I_in-1 increases until the time t1, in the present case, by way of example, linearly (cf. the curve K1). The curve K2 characterizes the first output current I_out-1 of the first comparator device 110-1 according to FIG. 6. It can be seen from FIG. 7 that the first output current K2 at the time t0 is equal to the first reference current I_ref-1, and that the first output current K2 then drops linearly to zero by the time t01 at which the first input current I_in-1, K1 exceeds the first reference current I_ref-1. The output signal out1 at the first circuit node 112-1-N1 (cf. the curve K3 according to FIG. 7) has a first state, for example logic one, between t0 and t01, for example based on the first operating voltage potential BP1-1 of the first comparator device.

As soon as the first input current I_in-1, K1 exceeds the first reference current I_ref-1 (see the time t01 according to FIG. 7), the output signal out1, K3 assumes a second state, for example logic zero, and while the first input current I_in-1, K1 increases further until the time t1, the first output current I_out-1, K2 also increases in a corresponding manner. It can be seen that, even in the event of a state transition of the output signal out1, K3 (see, for example, the time t01), no abrupt change in the first output current K2 occurs, but rather the temporal change of the first output current K2 is based on the temporal change of the first input current K1.

For example, the diode 116-1 according to FIG. 6 is conductive in the time period from t0 to t01 and blocking in the time period from t01 to t10. In further exemplary embodiments, the first differential current supply device 115-1 can provide the first output current I_out-1, while the diode 116-1 blocks.

In the present case, the first comparator device 110-1 according to FIG. 6 has been realized by means of p-channel field-effect transistors, for example of the MOSFET type, while the second comparator device 110-2 according to FIG. 6 is realized by means of n-channel MOSFETs. Such an alternating implementation of the MOSFETS of successive comparator devices 110-1, 110-2, . . . of the apparatus 100*a* can be advantageous in further exemplary embodiments because fewer components are thereby required than in an embodiment in which all transistors of the comparator devices 110-1, 110-2, . . . are of the same type, for example p-type or n-type. In addition, a number of transverse currents between adjacent comparator devices can thereby be reduced.

The function of the second comparator device 110-2 according to FIG. 6 corresponds substantially to the function of the first comparator device 110-1 according to FIG. 6, with the difference that the MOSFETs of the second comparator device 110-2 are in the present case, by way of example, of the n-channel type.

For example, it is provided that the second reference current device 114-2 comprises a transistor 114-2*a*, for example a field-effect transistor, the load path (drain-source path) of which is connected between the first circuit node 112-2-N1 and a first reference potential BP1-2 of the second comparator device 110-2. A second reference current I_ref-2 can thus be efficiently provided in further exemplary embodiments. In further exemplary embodiments, a current intensity of the second reference current I_ref-2 can be specified or influenced by at least one of the following elements: a) a control of the transistor 114-2*a*, b) dimensions of at least one component of the transistor 114-2*a*, e.g., gate width in the case of a field-effect transistor.

In further exemplary embodiments (FIG. 6), it is provided that the second differential current supply device 115-2 comprises a first transistor 115-2*a*, for example a field-effect transistor, the load path of which is connected between the second circuit node 112-2-N2 and a, or the, first reference potential BP1-2 of the second comparator device 110-2.

In further exemplary embodiments, it is provided that the first transistor 115-2*a* of the second differential current supply device 115-2 can be controlled based on an electrical potential of the first circuit node 112-2-N1 of the second comparator device 110-2, i.e., for example, based on a comparison result of the second comparator device 110-1 (see the output signal out 2).

For example, the first transistor 115-2*a* of the second differential current supply device 115-2, together with a second transistor 115-2*b* of the second differential current supply device 115-2, can form a current mirror device, which can, for example, be controlled by means of a third transistor 115-2*c* of the second differential current supply device 115-2, for example based on the electrical potential of the first circuit node 112-2-N1 of the second comparator device 110-2. In this way, it can be brought about efficiently that, as soon as the second input current I_in-2 exceeds the second reference current I_ref-2 and a change in potential thus occurs at the first circuit node 112-2-N1, the first transistor 115-2*a* of the second differential current supply device 115-2 provides the second output current I_out-2 from then on.

In further exemplary embodiments, the apparatus 100*a* according to FIG. 6 can, for example, comprise a third comparator device (not shown here) which is constructed, for example, in a comparable manner to the first comparator device 110-1 and, for example, just like the first comparator device 110-1, is realized by means of p-channel MOSFETs. In further exemplary embodiments, the apparatus 100*a* according to FIG. 6 can also comprise, for example, a fourth comparator device (not shown here), which, for example, is constructed in a comparable manner to the second comparator device 110-2 and, for example, just like the second comparator device 110-2, is realized by means of n-channel MOSFETs, etc., wherein an alternating implementation of successive comparator devices 110-1, 110-2 by means of MOSFETs of different types (p-channel, n-channel) can be advantageous.

Figure 8:
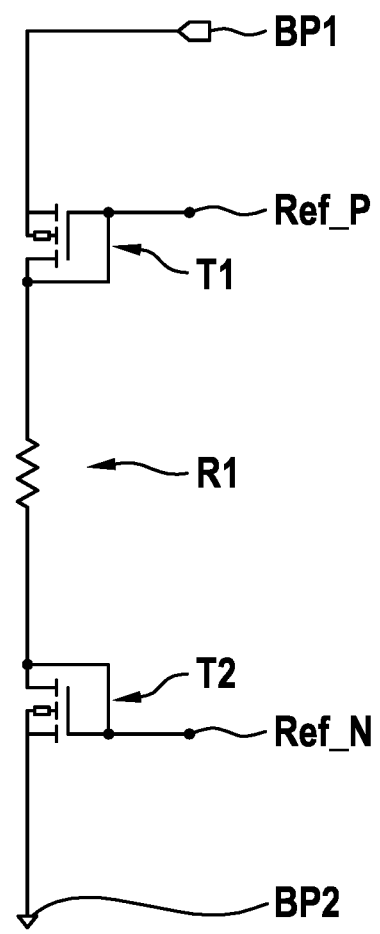
FIG. 8 schematically shows a simplified circuit diagram according to exemplary embodiments of the present invention.

FIG. 8 schematically shows a simplified circuit diagram according to exemplary embodiments. A resistor R1 is connected in series to the load paths of two transistors, for example MOSFETs T1 (e.g., p-channel MOSFET), T2 (e.g., n-channel MOSFET) in the present case, between electrical reference potentials BP1, BP2.

A first reference potential Ref_P applied, inter alia, to the gate electrode of the MOSFET T1 can be used, for example, to control the gate electrode of the transistor 114-1*a* according to FIG. 6 (and/or to control further gate electrodes of further transistors for providing a reference current in other comparator devices, for example also realized by means of MOSFETs of the p-channel type). If, for example, the same reference potential Ref_P is applied to the gate electrodes of a plurality of transistors for providing a reference current in different comparator devices, a current intensity of the reference current provided by the particular transistor can be brought about, for example, by adapting the gate width of the particular gate electrode.

A second reference potential Ref_N applied, inter alia, to the gate electrode of the MOSFET T2 according to FIG. 8 can be used, for example, to control the gate electrode of the transistor 114-2*a* according to FIG. 6 (and/or to control further gate electrodes of further transistors for providing a reference current in other comparator devices, for example also realized by means of MOSFETs of the n-channel type). If, for example, the same reference potential Ref_N is applied to the gate electrodes of a plurality of transistors for providing a reference current in different comparator devices, a current intensity of the reference current provided by each transistor can be brought about, for example, by adapting the gate width of the particular gate electrode.

In further exemplary embodiments, the two reference potentials Ref_P, Ref_N can thus be used (and are sufficient) to control the transistors providing the respective reference currents.

For example, the transistors T1, T2 can be used to form respective current mirror devices with corresponding transistors 114-1*a*, 114-2*a*, . . . of the comparator devices in order to provide the reference currents.

For example, the transistor T1, together with the transistor 114-1*a*, can form a current mirror device for providing the first reference current I_ref-1. For example, the transistor T2, together with the transistor 114-2*a*, can form a current mirror device for providing the second reference current I_ref-2, etc. By scaling the gate widths of the transistors 114-1*a*, 114-2*a* providing the particular reference current I_ref-1, I_ref-2, . . . for the different comparator devices, for example in a manner corresponding to a valency of a particular comparator device, for example in the sense of an analog/digital converter device, the reference potentials can also be used for a plurality of different comparator devices.

In further exemplary embodiments, the resistor R1 (FIG. 8) can be used, for example, to adjust a current flowing through the transistors T1, T2, whereby, for example, a reference current can be defined.

Alternatively to supplying the respective transistors 114-1a, 114-2a, . . . for providing the reference currents I_ref-1, I_ref-2, . . . by means of the circuit according to FIG. 8, each of the respective transistors 114-1a, 114-2a, . . . for providing the reference currents I_ref-1, I_ref-2, . . . can, for example, also be controlled individually, or can be part of a (e.g., respectively other) current mirror device, etc.

Figure 12:
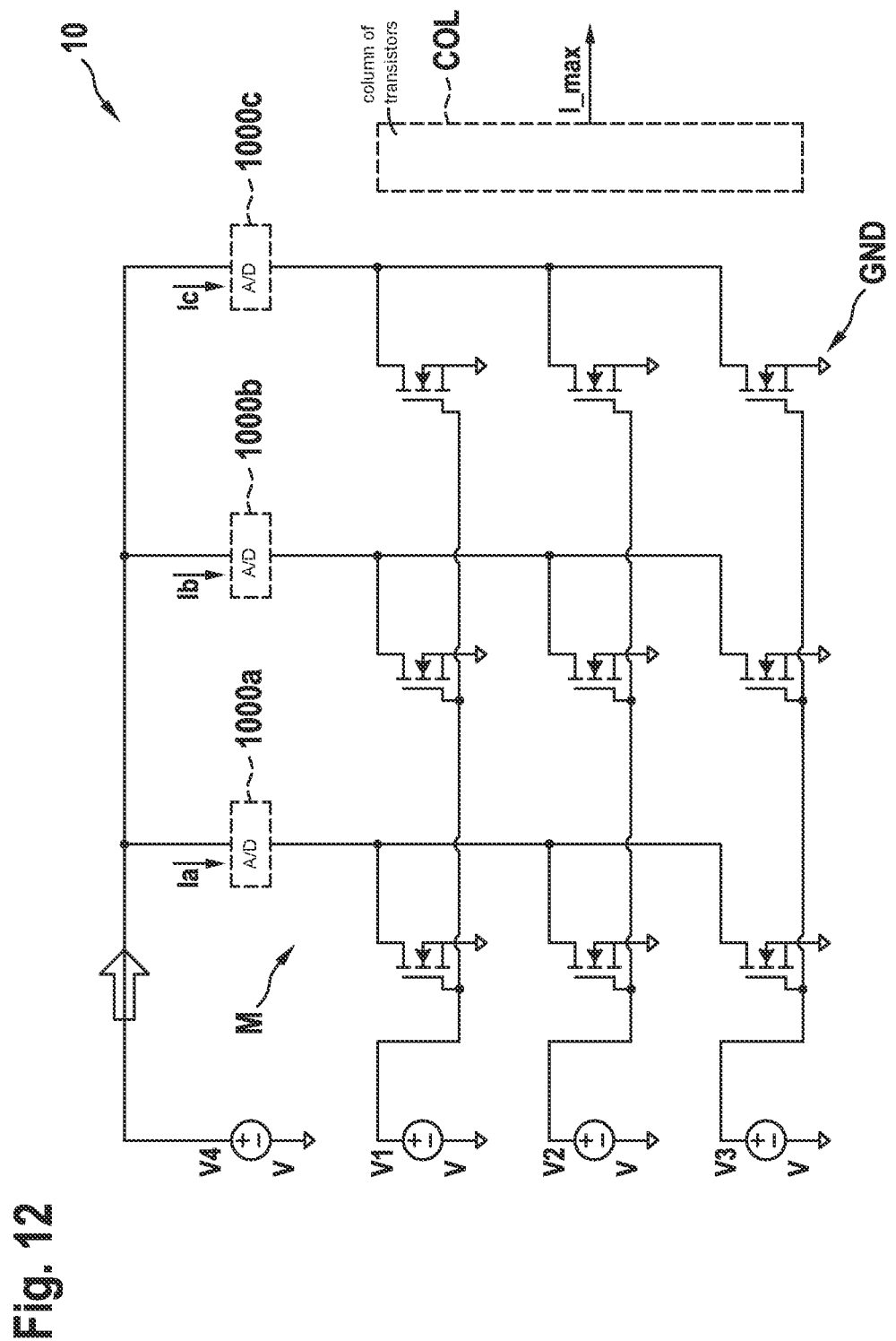
FIG. 12 schematically shows a simplified block diagram according to exemplary embodiments of the present invention.

In further exemplary embodiments, a switching element, e.g., a transistor, of a target system, for example a transistor of the computing device 10 according to FIG. 12, can be used to provide the reference potentials Ref_P, Ref_N. Details in this respect according to further exemplary embodiments are described below with respect to FIG. 12.

Further exemplary embodiments (FIG. 9) relate to an analog/digital converter device 1000, for example a current-driven analog/digital converter device 1000, comprising at least one apparatus 100b according to the embodiments. For example, the apparatus 100b can have a configuration 100 according to FIG. 1 and/or a configuration 100a according to FIG. 6, wherein, for example, successive comparator devices 110-1, 110-2, . . . are each realized alternately by means of p-channel MOSFETs (see element 110-1 according to FIG. 6) and n-channel MOSFETs (see element 110-2 according to FIG. 6).

In further exemplary embodiments (FIG. 9), in each case a comparator device of the apparatus can correspond to a stage of the analog/digital converter device. In further exemplary embodiments, a multistage, e.g., n-stage (n>=1), analog/digital converter device 1000 can thus be realized on the basis of an apparatus 100b with in the present case n=6 comparator devices 110-1, . . . , 110-6, which are, for example, electrically connected in series, for example in such a way that a first output current I_out-1 of the first comparator device 110-1 (FIG. 6) can be supplied to a second comparator device 110-2 as a second input current I_in-2, etc.

Figure 9:
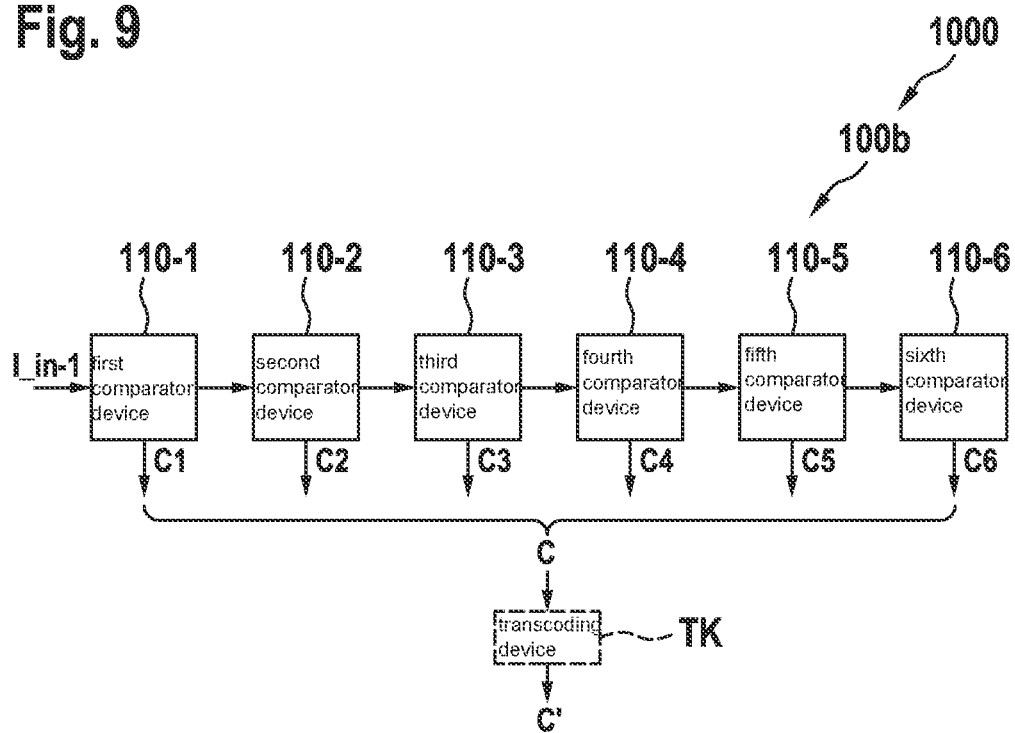
FIG. 9 schematically shows a simplified block diagram according to exemplary embodiments of the present invention.

The respective output signals of the comparator devices 110-1, . . . , 110-6, which characterize the comparison results of the respective input currents I_in-1, I_in-2, . . . with the particular reference current I_ref-1, I_ref-2, . . . , are symbolized in FIG. 9 by reference signs C1, C2, C3, C4, C5, C6 and together result in a binary value C.

In further exemplary embodiments (FIG. 9), it is provided that each of the n comparator devices 110-1, . . . , 110-6 is associated with a valency of the analog/digital converter device 1000, wherein a particular reference current of the n comparator devices 110-1, . . . , 110-6 is associated with the valency of the particular comparator device. For example, the second reference current I_ref-2 can be half as large as the first reference current I_ref-1; for example, a third reference current can be half as large as the second reference current I_ref-2, etc.

In further exemplary embodiments, alternatively, an identical reference can also be used for at least some stages of the analog/digital converter device 1000 (see above with respect to FIG. 8), wherein, for example, a gate width of the relevant transistors 114-1a, 114-2a, . . . is designed differently in order to realize, for example, the different valencies of different comparator devices 110-1, 110-2, . . . .

In further exemplary embodiments (FIG. 9), different reference currents, for example for different comparator devices 110-1, 110-2, . . . or stages of the analog/digital converter device 1000, can be provided by at least one of the following elements: a) individual reference current source, b) current mirror device.

In further exemplary embodiments (FIG. 9), it is provided that the analog/digital converter device 1000 is designed to transform the first input current I_in-1 into a digital, for example binary, variable C, wherein, for example, the digital variable comprises Gray coding (the Hamming distance of adjacent code words is one). In further exemplary embodiments, the Gray coding is advantageously obtained due to the formation of the apparatus 100, 100a, 100b according to the embodiments.

In further exemplary embodiments (FIG. 9), it is provided that a transcoding device TK is provided, which is designed to transcode a digital Gray-coded variable C into a binary-coded variable C'.

Figure 10:
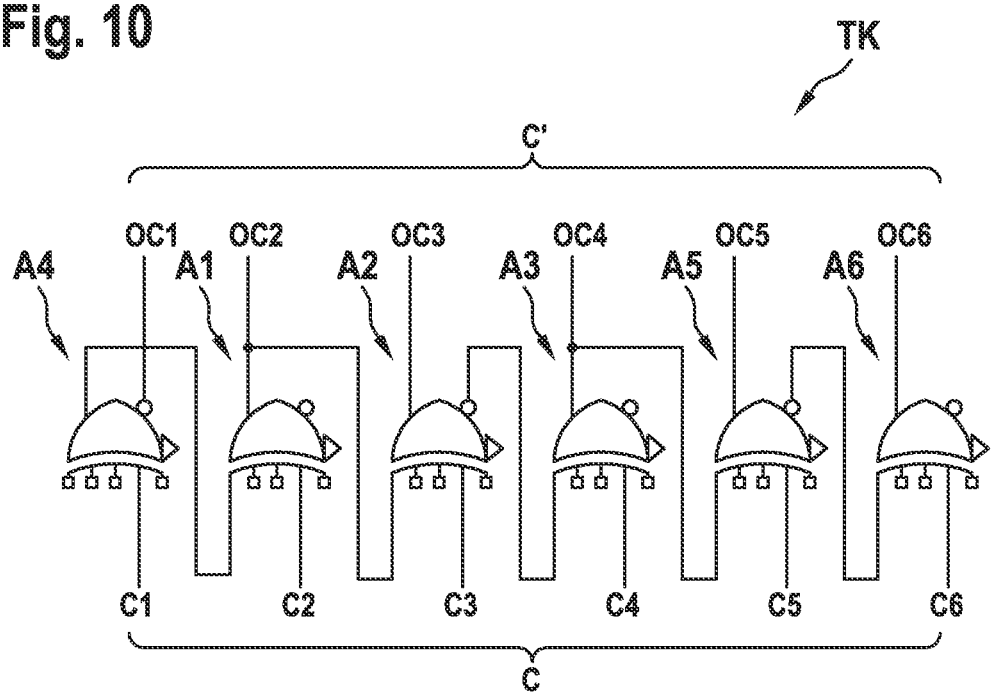
FIG. 10 schematically shows a simplified circuit diagram according to exemplary embodiments of the present invention.

FIG. 10 schematically shows a simplified circuit diagram of an exemplary transcoding device TK according to exemplary embodiments with a plurality of logic gates A1, A2, A3, A4, A5, A6. The individual digits of the Gray-coded variable C are supplied to the transcoding device TK, which transcodes them into a binary-coded variable C' with the digits OC1, OC2, OC3, OC4, OC5, OC6.

By way of example, the binary-coded output signals OC2, OC3, OC4, OC5, OC6, i.e., with the exception of the signal OC1, are obtained at the non-inverting outputs of the respective logic gates of the transcoding device TK.

By way of example, each of the logic gates of the transcoding device TK, with the exception of the first logic gate A1, to which the signal C1 is supplied, obtains an additional signal as an input signal from an adjacent logic gate (in FIG. 10 located to the left), for example such that the logic gates A1, A3, A6 associated with the "even" bits obtain an inverted output signal from other logic gates as shown in FIG. 10, wherein the logic gates A2, A5 associated with the "odd" bits obtain a non-inverted output signal from other logic gates as shown in FIG. 10.

Figure 11:
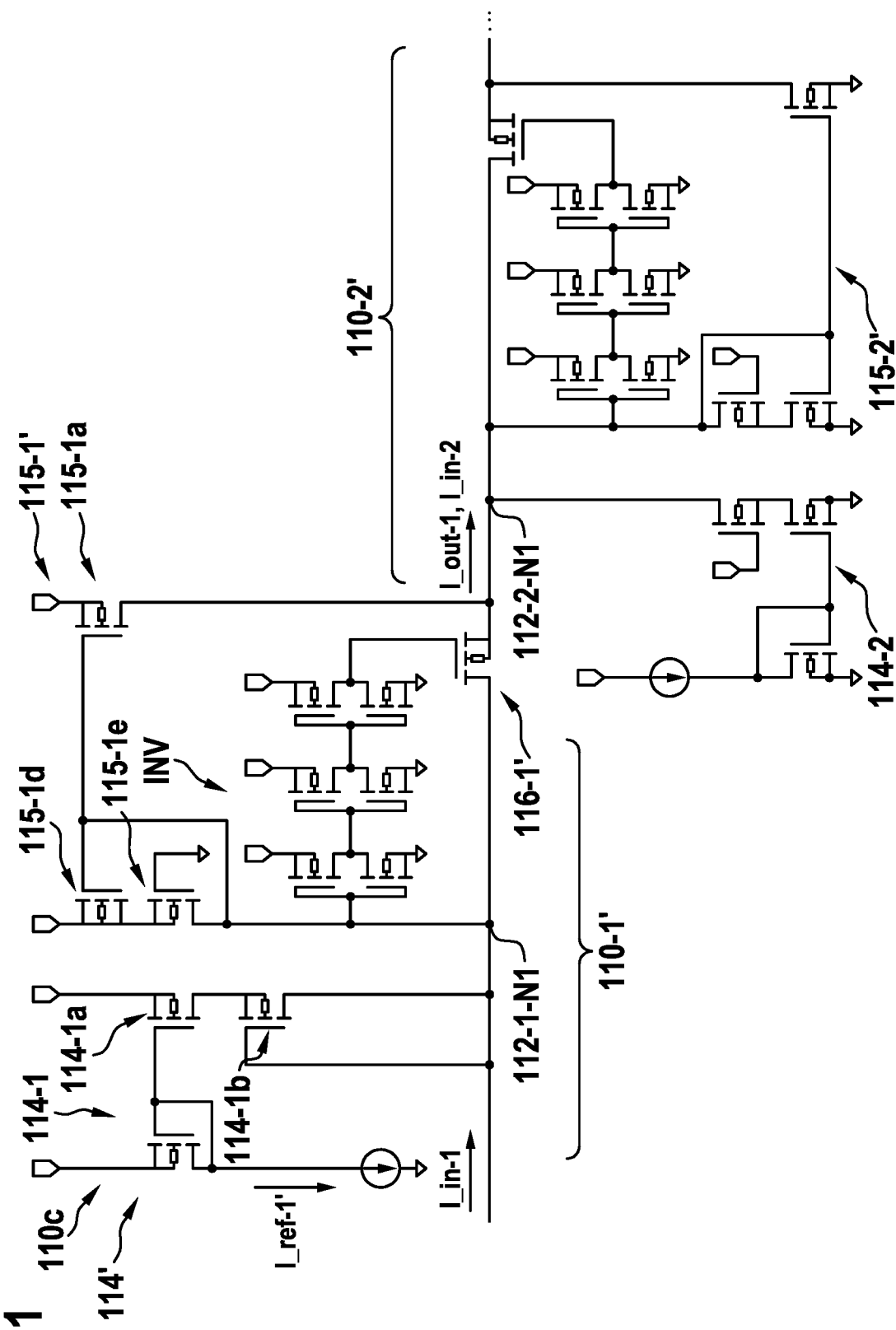
FIG. 11 schematically shows a simplified circuit diagram according to exemplary embodiments of the present invention.

FIG. 11 schematically shows a circuit diagram of an apparatus 100c which, similarly to FIG. 6, comprises at least two comparator devices 110-1', 110-2'.

Instead of a diode 116-1 according to FIG. 6, the element 116-1' for potential isolation according to FIG. 11 is designed as a transistor which, in further exemplary embodiments, brings about a smaller voltage drop in the "forward direction" than the diode 116-1 (e.g., MOSFET) with comparatively low R_DS_on, i.e., comparatively low drain-source resistance in the switched-on state, as a result of which a smaller supply voltage can be used and thus less electrical power loss can be achieved in further exemplary embodiments.

In further exemplary embodiments, the transistor 116-1' can be controlled, for example, by a multiple, in the present case, for example, triple, inverter INV, based on the electrical potential at the circuit node 112-1-N1.

In further exemplary embodiments, the transistor 116-1' can, for example, also be controlled by a single inverter, but a triple inverter INV is preferred in further exemplary embodiments because it can, for example, have a better time behavior (e.g., faster switching times) so that, for example, higher-frequency signals can also be processed.

In further exemplary embodiments, an inverted or a non-inverted, Gray-coded output signal in the range of the inverter INV can also be obtained, which offers further degrees of freedom, for example for an optional transcoding into another code, e.g., binary code.

The differential current supply device 115-1' according to FIG. 11 comprises transistors 115-1d, 115-1e, which, together with the transistor 115-1a, form a current mirror device. In further exemplary embodiments, the transistor 115-1e can, for example, be regarded or formed as a source follower circuit which provides a comparatively stable voltage for the drain electrode of the transistor 115-1d, which can further increase a stability and precision of the current mirror device in further exemplary embodiments.

In further exemplary embodiments, the gate electrode of the transistor 115-1d is connected as shown in FIG. 11 "around" the transistor 115-1e, i.e., for example, directly to the circuit node 112-1-N1, which enables operation with a comparatively low supply voltage in further exemplary embodiments.

In further exemplary embodiments, the comparator device 110-1' comprises a further transistor 114-1b, whereby, for example, a precision of the comparator device 110-1' can be further increased. The transistor 114-1b can, for example, also be connected as a source follower, for example in order to provide stable working conditions for the comparator device 110-1', for example independently of a voltage at an output.

In further exemplary embodiments, a circuit 114' is provided which provides a control voltage for the first reference current device 114-1, for example based on a first reference current I_ref-1'.

The further comparator device 110-2' according to FIG. 11 has a function comparable to the comparator device 110-1' but is realized with n-channel MOSFETs instead of p-channel MOSFETs.

Further exemplary embodiments (FIG. 12) relate to a computing device 10, for example for ascertaining a scalar product, for example a vector matrix multiplier, for example a dot product engine, comprising a matrix M of elements with a controllable electrical resistor (e.g., memristors or ferroelectric field-effect transistors), and at least one analog/digital converter device 1000a, 1000b, 1000c according to the embodiments. The analog/digital converter device 1000a, 1000b, 1000c has the configuration 1000 according to FIG. 9, for example.

For example, the at least one analog/digital converter device 1000a, 1000b, 1000c can be used according to exemplary embodiments for current measurement with respect to at least one column of the matrix M (cf. the currents Ia, Ib, Ic), in particular on a "high side," i.e., in the range of a comparatively large electrical potential, for example of an operating voltage potential different from a ground potential GND (cf. the voltage source V4).

In further exemplary embodiments, the computing device 10 can be used, for example, for machine learning (ML) methods or for applications in the field of artificial intelligence, for example for hardware accelerators for training deep neural networks (DNN).

In further exemplary embodiments, a switching element, e.g., transistor, of the computing device 10 can be used to provide the reference potentials Ref_P, Ref_N for the comparator devices 110-1, 110-2, . . . of the analog/digital converter devices 1000a, 1000b, 1000c (see also FIG. 8).

For example, a, for example separate, column of transistors, which is symbolized schematically by the dashed rounded rectangle COL in FIG. 12, can be provided in the matrix M, wherein the transistors of these column COL are, for example, each programmable or programmed to a specified value, for example all to "1." As a result, this column COL then outputs a current I max which corresponds to a maximum current which the matrix M can cause to flow. From the maximum current I max, for example, at least one reference voltage or at least one reference potential for the comparator devices 110-1, 110-2, . . . of the analog/digital converter devices 1000a, 1000b, 1000c can then be derived.

Alternatively to the programming of all transistors of the column COL to "1," it is also possible, for example, to program only a portion of the transistors of the column COL to "1" in further exemplary embodiments.

In further exemplary embodiments, FeFETs can, for example, be used as transistors of the column COL for providing the at least one reference potential, wherein component-related offsets and/or drift effects in the range of the matrix M then cancel out or compensate for one another.

Further exemplary embodiments (FIG. 2) relate to a method for operating an apparatus comprising at least a first comparator device 110-1 (FIG. 1), which is designed to compare a first input current with a first reference current and, based on the comparison, to output a first output current I_out-1 to a second comparator device 110-2, wherein the first output current corresponds to a difference of the first reference current and the first input current if the first input current is smaller than the first reference current, and wherein the first output current corresponds to a difference of the first input current and the first reference current if the first input current is greater than or equal to the first reference current, wherein the method comprises: comparing 200 (FIG. 2) the first input current with the first reference current, outputting 202 the first output current to a second comparator device.

Further exemplary embodiments (FIG. 13) relate to a use 300 of the apparatus 100, 100a, 100b, 100c according to the embodiments and/or of the analog/digital converter device 1000, 1000a, 1000b, 1000c according to the embodiments and/or of the computing device 10 according to the embodiments and/or of the method according to the embodiments for at least one of the following elements: a) converting 301 a current into a binary value, b) performing 302 binary coding, c) performing 303 Gray coding, d) providing 304 a current-driven, for example completely current-driven, analog-to-digital converter, e) avoiding (305) abrupt changes in a value of at least the first output current.

Below, further exemplary aspects and advantages according to further exemplary embodiments are described.

In further exemplary embodiments, the apparatus according to the embodiments or an A/D converter device according to the embodiments comprises a comparatively low electrical energy consumption.

In further exemplary embodiments, the configuration 100a, 100b, 100c, 1000, 1000a, 1000b, 1000c can be scaled, i.e., can, for example, be expanded by an i-bit resolution by adding i stages or comparator devices, i=1, 2, 3, . . . .

In further exemplary embodiments, the configuration 100a, 100b, 100c, 1000, 1000a, 1000b, 1000c comprises a temperature compensation, for example with respect to the generation of the reference currents.

In further exemplary embodiments, the A/D converter device does not require any additional electrical power supply since it can be supplied, for example, by the input current.

In further exemplary embodiments, the A/D converter device is current-driven, for example completely current-driven, which is potentially faster in comparison with a voltage-controlled operation.

In further exemplary embodiments, the principle according to the embodiments makes it possible to construct an A/D converter device of compact design with comparatively few components or structural elements.

For example, in further exemplary embodiments, an A/D converter device with an 8-bit resolution can be constructed by means of approximately 112 MOSFETs, which corresponds to less than approximately half a MOSFET per numerical step.

In further exemplary embodiments, the A/D converter device operates, for example completely, asynchronously, does not require a clock signal and/or iterations, and is therefore comparatively fast.

In further exemplary embodiments, by means of the reference potentials Ref_N, Ref_P, the reference currents and thus the switching thresholds for changes in state of the output signals out1, out2, . . . can be specified independently of one another and exactly. In addition, the reference potentials Ref_N, Ref_P can be used for a plurality of comparator devices.

SPONSORSHIP AND SUPPORT INFORMATION

The project that has led to this application was sponsored by the joint venture ECSEL (JU) within the framework of sponsorship agreement no. 826655. The JU is supported by the research and innovation program Horizon 2020 of the European Union and Belgium, France, Germany, the Netherlands, Switzerland

The invention claimed is:

1. An apparatus, comprising:
    at least a first comparator device configured to compare a first input current with a first reference current, and, based on the comparison, to output a first output current to a second comparator device, wherein the first output current corresponds to a difference of the first reference current and the first input current if the first input current is smaller than the first reference current, and the first output current corresponds to a difference of the first input current and the first reference current if the first input current is greater than or equal to the first reference current;
    wherein the apparatus comprises n comparator devices, wherein a k-th comparator device, with k=1, . . . , n−1, is configured to compare a supplied k-th input current with a k-th reference current, and, based on the comparison, to output a k-th output current to a (k+1)-th comparator device, wherein the k-th output current corresponds to a difference of the k-th reference current and the k-th input current if the k-th input current is smaller than the k-th reference current, and the k-th output current corresponds to a difference of the k-th input current and the k-th reference current if the k-th input current is greater than or equal to the k-th reference current.

2. The apparatus according to claim 1, wherein at least the first comparator device is configured to output a comparison result based on the comparison, in the form of a two-value signal.

3. The apparatus according to claim 1, wherein the first comparator device includes a first circuit node configured to receive the first input current, and a first reference current device, which is configured to derive the first reference current from the first circuit node, wherein, the k-th comparator device includes a particular first circuit node configured to receive a k-th input current, and a k-th reference current device, which is configured to derive the k-th reference current from the first circuit node of the k-th comparator device.

4. The apparatus according to claim 3, wherein the first reference current device is configured to provide the first output current at least temporarily, when the first input current is smaller than the first reference current, and wherein the k-th reference current device is configured to provide the k-th output current at least temporarily, when the k-th input current is smaller than the k-th reference current.

5. The apparatus according to claim 1, wherein the first comparator device includes a first differential current supply device, which is configured to provide the first output current at least temporarily, when the first input current is greater than or equal to the first reference current, and wherein the k-th comparator device includes a k-th differential current supply device, which is configured to provide the k-th output current at least temporarily, when the k-th input current is greater than or equal to the k-th reference current.

6. The apparatus according to claim 3, wherein the first comparator device includes a second circuit node configured to output the first output current to the second comparator device, and wherein the k-th comparator device includes a second circuit node configured to output the k-th output current to the (k+1)-th comparator device.

7. The apparatus according to claim 6, wherein an element for potential isolation is provided between the first circuit node of the first comparator device and the second circuit node of the first comparator device, and wherein the element for potential isolation includes at least one of the following elements: a) a diode, b) a transistor.

8. The apparatus according to claim 3, wherein the first comparator device includes a third circuit node configured to receive the first input current, and wherein the k-th comparator device includes a third circuit node configured to receive the k-th input current.

9. The apparatus according to claim 8, wherein an element for potential isolation is provided between the first circuit node of the first comparator device and the third circuit node of the first comparator device, wherein the element for potential isolation includes a field-effect transistor configured as a source follower.

10. The apparatus according to claim 1, wherein the first reference current device includes a field-effect transistor, a load path of which is connected between the first circuit node of the first comparator device and a first reference potential of the first comparator device.

11. The apparatus according to claim 6, wherein the first differential current supply device includes a first transistor, a load path of which is connected between the second circuit node of the first comparator device and a first reference potential of the first comparator device.

12. The apparatus according to claim 1, wherein the apparatus is used for at least one of the following elements: a) converting a current into a binary value, b) performing binary coding, c) performing Gray coding, d) providing a completely, current-driven analog-to-digital converter, e) avoiding abrupt changes in a value of at least the first output current.

13. An analog/digital converter device, comprising:
    at least one apparatus, including:
        at least a first comparator device configured to compare a first input current with a first reference current, and, based on the comparison, to output a first output current to a second comparator device, wherein the first output current corresponds to a difference of the first reference current and the first input current if the first input current is smaller than the first reference current, and the first output current corresponds to a difference of the first input current and the first reference current if the first input current is greater than or equal to the first reference current;

wherein the at least one apparatus includes n comparator devices, wherein a k-th comparator device, with k=1 . . . , n−1, is configured to compare a supplied k-th input current with a k-th reference current, and, based on the comparison, to output a k-th output current to a (k+1)-th comparator device, wherein the k-th output current corresponds to a difference of the k-th reference current and the k-th input current if the k-th input current is smaller than the k-th reference current, and the k-th output current corresponds to a difference of the k-th input current and the k-th reference current if the k-th input current is greater than or equal to the k-th reference current, wherein each of the n comparator devices is associated with a valency of the analog/digital converter device, and wherein a particular reference current of the n comparator devices is associated with a valency of a particular comparator device.

14. The analog/digital converter device according to claim 13, wherein the analog/digital converter device is configured to transform the first input current into a digital variable, and wherein the digital variable includes Gray coding.

15. A computing device for ascertaining a scalar product, comprising:
   a matrix of elements including a controllable electrical resistor; and
   at least one analog/digital converter device including:
      at least one apparatus, including:
         at least a first comparator device configured to compare a first input current with a first reference current, and, based on the comparison, to output a first output current to a second comparator device, wherein the first output current corresponds to a difference of the first reference current and the first input current if the first input current is smaller than the first reference current, and the first output current corresponds to a difference of the first input current and the first reference current if the first input current is greater than or equal to the first reference current;
      wherein the at least one apparatus includes n comparator devices, wherein a k-th comparator device, with k=1, . . . , n−1, is configured to compare a supplied k-th input current with a k-th reference current, and, based on the comparison, to output a k-th output current to a (k+1)-th comparator device, wherein the k-th output current corresponds to a difference of the k-th reference current and the k-th input current if the k-th input current is smaller than the k-th reference current, and the k-th output current corresponds to a difference of the k-th input current and the k-th reference current if the k-th input current is greater than or equal to the k-th reference current.

16. A method for operating an apparatus including at least a first comparator device configured to compare a first input current with a first reference current, and, based on the comparison, to output a first output current to a second comparator device, where in the first output current corresponds to a difference of the first reference current and the first input current when the first input current is smaller than the first reference current, and the first output current corresponds to a difference of the first input current and the first reference current when the first input current is greater than or equal to the first reference current, wherein the method comprises the following steps:

comparing the first input current with the first reference current; and outputting the first output current to a second comparator device;

wherein the apparatus includes n comparator devices, wherein a k-th comparator device, with k=1, . . . , n−1, is configured to compare a supplied k-th input current with a k-th reference current, and, based on the comparison, to output a k-th output current to a (k+1)-th comparator device, wherein the k-th output current corresponds to a difference of the k-th reference current and the k-th input current if the k-th input current is smaller than the k-th reference current, and the k-th output current corresponds to a difference of the k-th input current and the k-th reference current if the k-th input current is greater than or equal to the k-th reference current.

\* \* \* \* \*